US012774987B2

(12) United States Patent
Shimozaki et al.

(10) Patent No.: US 12,774,987 B2
(45) Date of Patent: Oct. 27, 2026

(54) METHOD OF ESTIMATING OXYGEN CONCENTRATION IN SILICON SINGLE CRYSTAL, METHOD OF MANUFACTURING SILICON SINGLE CRYSTAL, AND SILICON SINGLE CRYSTAL MANUFACTURING APPARATUS

(71) Applicant: SUMCO Corporation, Tokyo (JP)

(72) Inventors: Ippei Shimozaki, Tokyo (JP); Keiichi Takanashi, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 292 days.

(21) Appl. No.: 18/036,988

(22) PCT Filed: Dec. 6, 2021

(86) PCT No.: PCT/JP2021/044675
§ 371 (c)(1),
(2) Date: May 15, 2023

(87) PCT Pub. No.: WO2022/124259
PCT Pub. Date: Jun. 16, 2022

(65) Prior Publication Data

US 2024/0019397 A1 Jan. 18, 2024

(30) Foreign Application Priority Data

Dec. 8, 2020 (JP) ................................. 2020-203240

(51) Int. Cl.
*G01N 27/74* (2006.01)
*C30B 15/22* (2006.01)
*C30B 29/06* (2006.01)

(52) U.S. Cl.
CPC ............ *G01N 27/74* (2013.01); *C30B 15/22* (2013.01); *C30B 29/06* (2013.01)

(58) Field of Classification Search
CPC ......... C30B 15/20; C30B 15/22; C30B 15/26; C30B 29/06; C30B 30/04; G01N 27/74
See application file for complete search history.

(56) References Cited

U.S. PATENT DOCUMENTS 5,408,952 A * 4/1995 Wakabayashi .......... C30B 29/06
117/201
10,858,753 B2 12/2020 Sugimura et al.
(Continued)

FOREIGN PATENT DOCUMENTS

CN 102677157 A * 9/2012
DE 11 2017 002 662 B4 1/2021
(Continued)

OTHER PUBLICATIONS

ISR issued in International Patent Application No. PCT/JP2021/044675, Dec. 28, 2021, translation.
(Continued)

*Primary Examiner* — Hua Qi
(74) *Attorney, Agent, or Firm* — GREENBLUM & BERNSTEIN, P.L.C.

(57) ABSTRACT

To provide a method of estimating an oxygen concentration in a silicon single crystal, a method of manufacturing a silicon single crystal, and a silicon single crystal manufacturing apparatus capable of manufacturing silicon single crystals having constant quality by preventing polarization of the oxygen concentration in the silicon single crystal. A method of estimating an oxygen concentration in a silicon single crystal according to the present invention is provided with measuring a height (gap) of a melt surface of a silicon melt in a quartz crucible when pulling up a silicon single crystal while applying a lateral magnetic field to the silicon
(Continued)

melt and estimating an oxygen concentration in the silicon single crystal from a minute variation in the height of the melt surface.

7 Claims, 10 Drawing Sheets

(56) References Cited

U.S. PATENT DOCUMENTS

| | | | | |
|---|---|---|---|---|
| 2010/0064964 | A1* | 3/2010 | Hoshi | C30B 15/26 117/15 |
| 2013/0263773 | A1* | 10/2013 | Takanashi | C30B 15/26 117/15 |
| 2020/0399780 | A1 | 12/2020 | Sugimura et al. | |
| 2020/0407870 | A1 | 12/2020 | Matsukuma et al. | |
| 2020/0407875 | A1 | 12/2020 | Matsushima et al. | |
| 2021/0108337 | A1 | 4/2021 | Yokoyama et al. | |

FOREIGN PATENT DOCUMENTS

| | | | | |
|---|---|---|---|---|
| JP | 07-257990 | A | 10/1995 | |
| JP | 2019-151499 | A | 9/2019 | |
| JP | 2019-151500 | A | 9/2019 | |
| JP | 2019-151503 | A | 9/2019 | |
| RU | 2542292 | C2 * | 2/2015 | |
| TW | 201938851 | A | 10/2019 | |
| WO | WO-2009025336 | A1 * | 2/2009 | C30B 15/203 |

OTHER PUBLICATIONS

IPRP issued in International Patent Application No. PCT/JP2021/044675, Jun. 13, 2023, translation.

Office Action issued in German Patent Application No. 11 2021 006 395.2, 9 Dec. 9, 2024, translation.

* cited by examiner

METHOD OF ESTIMATING OXYGEN CONCENTRATION IN SILICON SINGLE CRYSTAL, METHOD OF MANUFACTURING SILICON SINGLE CRYSTAL, AND SILICON SINGLE CRYSTAL MANUFACTURING APPARATUS

TECHNICAL FIELD

The present invention relates to a method of estimating an oxygen concentration in a silicon single crystal manufactured by a Czochralski method. The present invention also relates to a method of manufacturing a silicon single crystal and a silicon single crystal manufacturing apparatus using the method of estimating the oxygen concentration and, more particularly, to an MCZ method (Magnetic field applied Czochralski method) that pulls up a single crystal while applying a magnetic field to a melt.

BACKGROUND ART

An MCZ method is known as a variation of a CZ method for manufacturing a silicon single crystal. The MCZ method is a method that pulls up a single crystal while applying a magnetic field to a silicon melt in a quartz crucible to suppress melt convection. Suppressing melt convection can inhibit reaction between the quartz crucible and melt, which in turn suppresses the amount of oxygen to be dissolved into the silicon melt, with the result that the oxygen concentration in the silicon single crystal can be reduced to a low level.

There are a variety of methods for the magnetic field application, and among them, an HMCZ method (Horizontal MCZ method) that applies a horizontal magnetic field is being in practical use. The HMCZ method applies a magnetic field perpendicular to the side wall of a quartz crucible, so that melt convection around the crucible side wall is effectively suppressed to reduce the dissolution amount of oxygen from the crucible. On the other hand, the convection suppression effect is small at a melt surface, and evaporation of oxygen (silicon oxide) from the melt surface is not suppressed significantly, so that oxygen concentration in the melt can be reduced. Therefore, a single crystal with a low oxygen concentration can be grown.

In regard to the HMCZ method, for example Patent Literature 1 describes a method that measures the surface temperature of a silicon melt at a position of a hot zone shape forming a plane-asymmetric structure in at least one of necking and shoulder section forming steps of a silicon single crystal and estimates oxygen concentration in the silicon single crystal from the measured surface temperature.

Further, Patent Literature 2 describes that the flow of inert gas flowing between the lower end of a heat shielding body and a silicon melt surface forms a flow distribution which is asymmetric to a plane containing a crystal pull-up axis and a horizontal magnetic field application direction and rotationally asymmetric to the crystal pull-up axis, and the formed plane-asymmetrical and rotationally-asymmetric flow distribution is maintained in the absence of a magnetic field until a silicon raw material in the crucible is completely melted.

RELATED ART

Patent Literature

Patent Literature 1: Japanese Patent Laid-open Publication No. 2019-151499

Patent Literature 2: Japanese Patent Laid-open Publication No. 2019-151503

SUMMARY OF THE INVENTION

Problem to be Solved by the Invention

Recent studies reveal that, in a silicon single crystal pull-up process with horizontal magnetic field application in the Czochralski method, even when a silicon single crystal is pulled up with the same pull-up apparatus under the same pull-up conditions, the quality of the pulled-up silicon single crystal does not become constant and, in particular, the oxygen concentration in the silicon single crystal becomes polarized.

Although the technologies described in Patent Literatures 1 and 2 are useful for solving such a problem, other methods are required to solve this problem.

It is therefore an object of the present invention to provide a method of estimating an oxygen concentration in a silicon single crystal, a method of manufacturing a silicon single crystal, and a silicon single crystal manufacturing apparatus capable of manufacturing silicon single crystals having constant quality by preventing polarization of the oxygen concentration in the silicon single crystal.

Means for Solving the Problem

To solve the above problem, a method of estimating an oxygen concentration in a silicon single crystal according to the present invention includes measuring a height of a melt surface of a silicon melt in a quartz crucible when pulling up a silicon single crystal while applying a lateral magnetic field to the silicon melt and estimating an oxygen concentration in the silicon single crystal from a minute variation in the height of the melt surface.

According to the present invention, it is possible to estimate whether the oxygen concentration in the silicon single crystal assumes a relatively high value or low value, that is, the polarization direction of the oxygen concentration in the silicon single crystal. Thus, by controlling crystal growth conditions based on the estimation result of the oxygen concentration, it is possible to suppress a variation in the oxygen concentration in the crystal growth direction of the silicon single crystal.

The method of estimating an oxygen concentration in a silicon single crystal according to the present invention preferably periodically measures the height of the melt surface with a sampling period of 50 seconds or less, more preferably, 10 seconds or less. This allows a minute variation of the melt surface depending on a difference in a convection mode of the silicon melt to be grasped, thus making it possible to estimate the polarization direction of the oxygen concentration from the minute variation of the melt surface. Although the minute variation of the melt surface can be grasped clearer as the sampling period becomes shorter, the sampling period is preferably set to one second or more so as to prevent data amount from becoming enormous.

In the present invention, a resolution of a measurement value of the height of the melt surface is preferably 0.1 mm or less. This makes it possible to accurately grasp the minute variation of the melt surface depending on a difference in a convection mode of the silicon melt and to estimate the polarization direction of the oxygen concentration from the grasped minute variation of the melt surface. The minute variation of the melt surface depending on a difference in a convection mode of the silicon melt moves up and down with a short period of 50 seconds or less, and the variation amount thereof is small and is 1 mm or less in terms of standard deviation. Further, by measuring the height position of the melt surface with a measurement range on the melt surface defined, it is possible to grasp the minute variation of the melt surface. In other words, the minute variation refers to a vertical variation of 1 mm or less in terms of standard deviation of the height of the melt surface when the melt surface height is measured with a sampling period of 50 seconds or less.

The method of estimating an oxygen concentration in a silicon single crystal according to the present invention preferably identifies, from previous result data on silicon single crystal pull-up, the correlation between the minute variation in the height of the melt surface and the polarization direction of the oxygen concentration and estimates the oxygen concentration in the silicon single crystal based on the identified correlation. This makes it possible to enhance estimation accuracy of the polarization direction of the oxygen concentration in the silicon single crystal.

The method of estimating an oxygen concentration in a silicon single crystal according to the present invention preferably identifies, from previous result data on silicon single crystal pull-up, a crystal part where the polarization of the oxygen concentration appears and sets a period in which the identified crystal part is grown as a sampling period for measuring the height of the melt surface. This makes it possible to enhance estimation accuracy of the polarization direction of the oxygen concentration in the silicon single crystal.

The method of estimating an oxygen concentration in a silicon single crystal according to the present invention preferably estimates the oxygen concentration in the silicon single crystal from the minute variation in the height of the melt surface measured within a certain range ranging downward from the upper end of a body part of the silicon single crystal. This makes it possible to early estimate the polarization direction of the oxygen concentration in the early stage to thereby suppress a variation in the oxygen concentration in the silicon single crystal, which can make oxygen concentration distribution uniform in the crystal axis direction.

For grasping the minute variation of the melt surface, it is preferable to measure the height position of the melt surface with reference to the lower end of a heat shielding body disposed above the silicon melt. That is, it is preferable to measure a gap (hereinafter, sometimes described as "GAP") between the heat shielding body disposed above the silicon melt and the melt surface to grasp the minute variation in the height of the melt surface. From the variation in the measured gap value, the minute variation of the melt surface can be accurately measured. Thus, it is possible to enhance the estimation accuracy of the oxygen concentration in the silicon single crystal.

Further, A method of manufacturing a silicon single crystal according to the present invention includes a silicon single crystal manufacturing step of pulling up a silicon single crystal while applying a lateral magnetic field to a silicon melt in a quartz crucible, and the silicon single crystal manufacturing step estimates the oxygen concentration in the silicon single crystal according to the above-described silicon single crystal oxygen concentration estimation method according to the present invention and adjusts crystal growth conditions such that an estimation value of the oxygen concentration in the silicon single crystal becomes close to a target value.

Further, a silicon single crystal manufacturing apparatus according to the present invention includes: a crystal pull-up furnace; a quartz crucible supporting a silicon melt in the crystal pull-up furnace; a crucible rotary mechanism rotating and lifting/lowering the quartz crucible; a magnetic field generator applying a lateral magnetic field to the silicon melt; a crystal pull-up mechanism pulling up a silicon single crystal from the silicon melt; a melt surface measurement unit periodically measuring the height of a melt surface of the silicon melt; and a controller controlling crystal growth conditions. The controller estimates the oxygen concentration in the silicon single crystal from the behavior of a minute variation in the height of the melt surface and adjusts the crystal growth conditions such that the estimation value of the oxygen concentration in the silicon single crystal becomes close to a target value.

According to the present invention, it is possible to estimate whether the oxygen concentration in the silicon single crystal becomes a relatively high value or a relatively low value from the minute variation of the melt surface. Thus, by controlling crystal growth conditions based on the estimation result of the oxygen concentration, it is possible to suppress a variation in the oxygen concentration in the crystal growth direction of the silicon single crystal.

The crystal growth conditions preferably include at least one of a rotation speed of the quartz crucible, a flow rate of inert gas to be supplied into the crystal pull-up furnace, and a pressure inside the crystal pull-up furnace. This makes it possible to suppress a variation in the oxygen concentration in the silicon single crystal.

Effects of the Invention

According to the present invention, there can be provided a method of estimating an oxygen concentration in a silicon single crystal, a method of manufacturing a silicon single crystal, and a silicon single crystal manufacturing apparatus capable of manufacturing silicon single crystals having constant quality by preventing polarization of the oxygen concentration in the silicon single crystal.

BRIEF DESCRIPTION OF THE DRAWINGS

FIGS. 5A and 5B are diagram illustrating flows of the silicon melt in the crucible to which lateral magnetic field is applied, wherein FIG. 5A shows a role flow of the right-hand turning (clockwise), and FIG. 5B shows a role flow of the left-hand turning (counterclockwise).

FIGS. 7A and 7B are graphs illustrating the relation between the minute gap variation (GAP variation) and the oxygen concentration, wherein FIG. 7A illustrates a case where the oxygen concentration in the silicon single crystal becomes high, and FIG. 7B illustrates a case where the oxygen concentration in the silicon single crystal becomes low.

MODE FOR CARRYING OUT THE INVENTION

Hereinafter, a preferred embodiment of the present invention will be described in detail with reference to the accompanying drawings.

Figure 1:
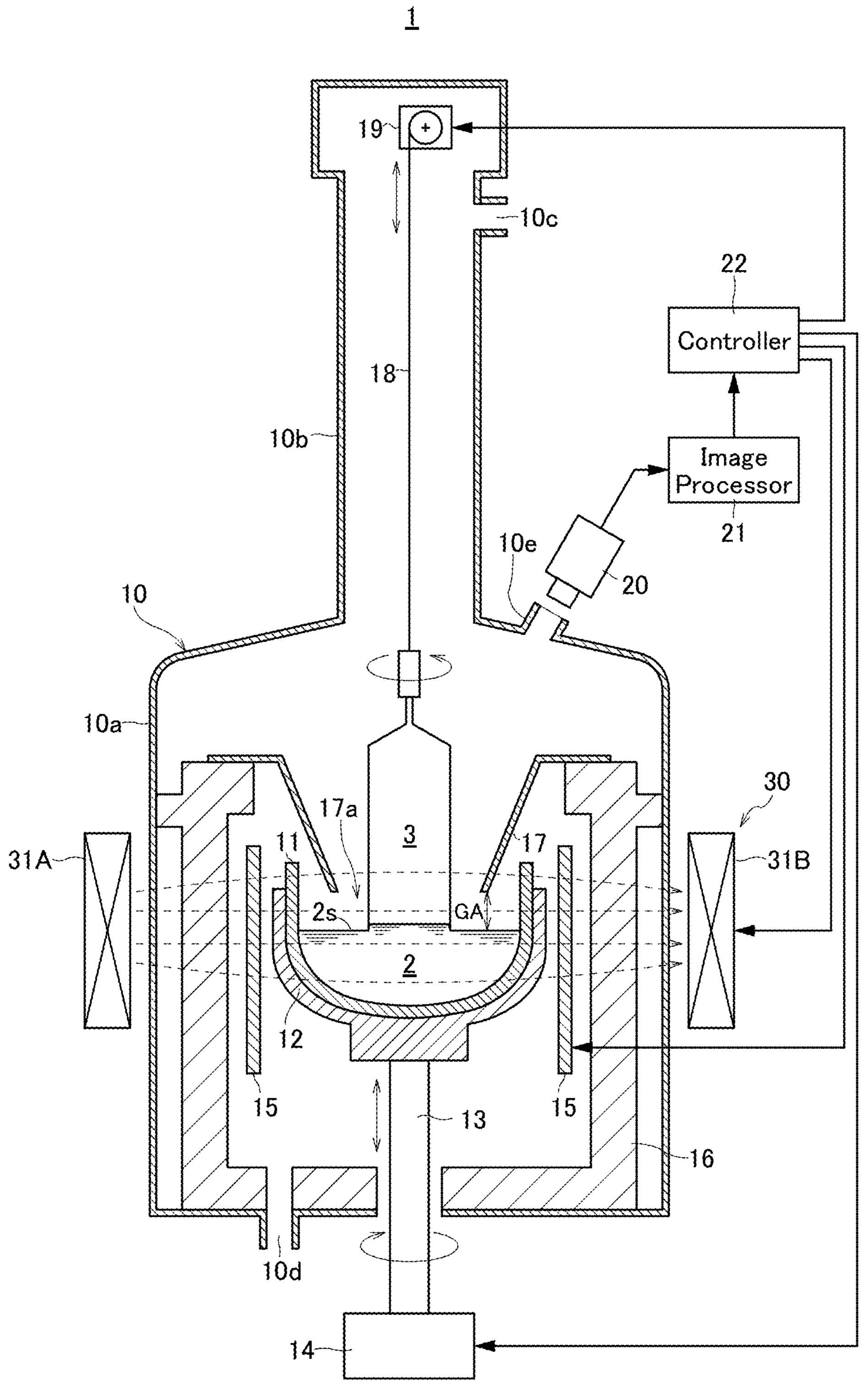
FIG. 1 is a cross-sectional side view schematically illustrating the configuration of a silicon single crystal manufacturing apparatus according to an embodiment of the present invention.

FIG. 1 is a cross-sectional side view schematically illustrating the configuration of a silicon single crystal manufacturing apparatus according to an embodiment of the present invention.

As illustrated in FIG. 1, a silicon single crystal manufacturing apparatus 1 includes a chamber 10 constituting a crystal pull-up furnace, a quartz crucible 11 holding a silicon melt 2 in the chamber 10, a graphite crucible 12 supporting the quartz crucible 11, a rotary shaft 13 supporting the graphite crucible 12, a shaft drive mechanism 14 for rotating and lifting/lowering the rotary shaft 13, a heater 15 disposed around the graphite crucible 12, a heat insulating material 16 disposed outside the heater 15 and along the inner surface of the chamber 10, a heat shielding body 17 disposed above the quartz crucible 11, a pull-up wire 18 disposed above the quartz crucible 11 so as to be coaxial with the rotary shaft 13, and a wire winding mechanism 19 disposed above the chamber 10.

The chamber 10 is constituted of a main chamber 10*a* and an elongated cylindrical pull chamber 10*b* connected to an upper opening of the main chamber 10*a*, and the quartz crucible 11, graphite crucible 12, heater 15, and heat shielding body 17 are provided inside the main chamber 10*a*. A gas inlet 10*c* for introducing inert gas (purge gas) such as Ar gas or dopant gas into the chamber 10 is formed in the pull chamber 10*b*, and a gas outlet 10*d* for discharging atmospheric gas is formed at the lower part of the main chamber 10*a*.

The quartz crucible 11 is a quartz glass container having a cylindrical side wall part and a curved bottom part. The graphite crucible 12 tightly contacts the outer surface of the quartz crucible 11 to cover and hold the quartz crucible 11 so as to maintain the shape of the quartz crucible 11 soften by heating. The quartz crucible 11 and graphite crucible 12 constitute a double-structured crucible that supports the silicon melt in the chamber 10.

The graphite crucible 12 is fixed to the upper end portion of the rotary shaft 13. The lower end portion of the rotary shaft 13 penetrates the bottom of the chamber 10 to be connected to the shaft drive mechanism 14 provided outside the chamber 10. The rotary shaft 13 and shaft drive mechanism 14 constitute a crucible rotary mechanism for rotating and lifting/lowering the quartz crucible 11 and graphite crucible 12.

The heater 15 is used to melt a silicon raw material filled in the quartz crucible 11 to generate the silicon melt 2 and maintain the molten state thereof. The heater 15 is a resistance heating type heater made of carbon and is provided so as to surround the quartz crucible 11 in the graphite crucible 12. The heater 15 is surrounded by the heat insulating material 16, whereby heat retention performance inside the chamber 10 can be enhanced.

The heat shielding body 17 is provided for suppressing a variation in temperature of the silicon melt 2 to form an adequate hot zone around a crystal growth interface and preventing a silicon single crystal 3 from being heated by radiation heat from the heater 15 and quartz crucible 11. The heat shielding body 17 is a graphite member covering an area above the silicon melt 2 excluding a pull-up path for the silicon single crystal 3 and has, for example, an inverted truncated conical shape whose aperture size increases from the lower to upper ends thereof.

The diameter of an opening 17*a* at the lower end of the heat shielding body 17 is larger than the diameter of the silicon single crystal 3, thus ensuring the pull-up path for the silicon single crystal 3. Further, the diameter of the opening 17*a* of the heat shielding body 17 is smaller than the aperture diameter of the quartz crucible 11, and the lower end portion of the heat shielding body 17 is positioned inside the quartz crucible 11, so that even when the rim upper end of the quartz crucible 11 is lifted up beyond the lower end of the heat shielding body 17, the heat shielding body 17 does not interfere with the quartz crucible 11.

The amount of melt in the quartz crucible 11 decreases with the growth of the silicon single crystal 3; however, by lifting the quartz crucible 11 so as to maintain a gap GA between a melt surface 2*s* and the lower end of the heat shielding body 17 constant, it is possible to suppress a variation in temperature of the silicon melt 2 and to make the flow rate of a gas flowing around the melt surface 2*s* constant, whereby the evaporation amount of a dopant from the silicon melt 2 can be controlled. This makes it possible to enhance the stability of a crystal defect distribution, an oxygen concentration distribution, a resistivity distribution, etc., in the pull-up axis direction of the silicon single crystal 3.

The pull-up wire 18 serving as the pull-up axis of the silicon single crystal 3 and the wire winding mechanism 19 winding the pull-up wire 18 are provided above the quartz crucible 11. The wire winding mechanism 19 has a function of rotating the silicon single crystal 3 together with the wire 18. The wire winding mechanism 19 is provided at the upper portion of the pull chamber 10*b*. The pull-up wire 18 extends downward from the wire winding mechanism 19, passing through the pull chamber 10*b* until the leading end thereof reaches the inner space of the main chamber 10*a*. FIG. 1 illustrates a state where the silicon single crystal 3 being grown is suspended by the pull-up wire 18. Upon pull-up of the silicon single crystal 3, the pull-up wire 18 is gradually pulled up while the quartz crucible 11 and silicon single crystal 3 are being rotated to grow the silicon single crystal 3. As described above, the pull-up wire 18 and wire winding mechanism 19 constitute a crystal pull-up mechanism for pulling up the silicon single crystal 3 from the silicon melt 2.

An observation window 10*e* for observing the inside of the chamber 10 is provided at the upper portion of the main chamber 10*a* to allow a growing state of the silicon single crystal 3 to be observed therethrough. A camera 20 is installed outside the observation window 10*e*. During a single crystal pull-up process, the camera 20 photographs from obliquely upward a boundary portion between the silicon single crystal 3 and the silicon melt 2 which can be viewed from the observation window 10*e* through the opening 17*a* of the heat shielding body 17. The image photographed by the camera 20 is processed in an image processor 21, and a controller 22 uses processing results to control crystal pull-up conditions.

The silicon single crystal manufacturing apparatus 1 includes a magnetic field generator 30 that applies a lateral magnetic field (a horizontal magnetic field) to the silicon melt 2 in the quartz crucible 11. The magnetic field generator 30 has a pair of electromagnetic coils 31A and 31B disposed opposite to each other across the main chamber 10*a*. The electromagnetic coils 31A and 31B operate according to an instruction from the controller 22 and are thereby controlled in terms of magnetic field intensity. The center position (magnetic field center position) of the horizontal magnetic field generated by the magnetic field generator 30 refers to a height-direction position of a horizontal line (magnetic field center line) connecting the centers of the opposed electromagnetic coils 31A and 31B. According to the horizontal magnetic field method, convection of the silicon melt 2 can be effectively suppressed.

In the pull-up process of the silicon single crystal 3, a seed crystal is lowered to be dipped into the silicon melt 2. Then, the seed crystal is gradually lifted while the seed crystal and quartz crucible 11 are being rotated, whereby the silicon single crystal 3 having a substantially columnar shape is grown below the seed crystal. At this time, the diameter of the silicon single crystal 3 is adjusted by controlling pull-up speed of the silicon single crystal 3 and power of the heater 15. Further, by applying the horizontal magnetic field to the silicon melt 2, melt convection in a direction perpendicular to magnetic force lines can be suppressed.

Figure 2:
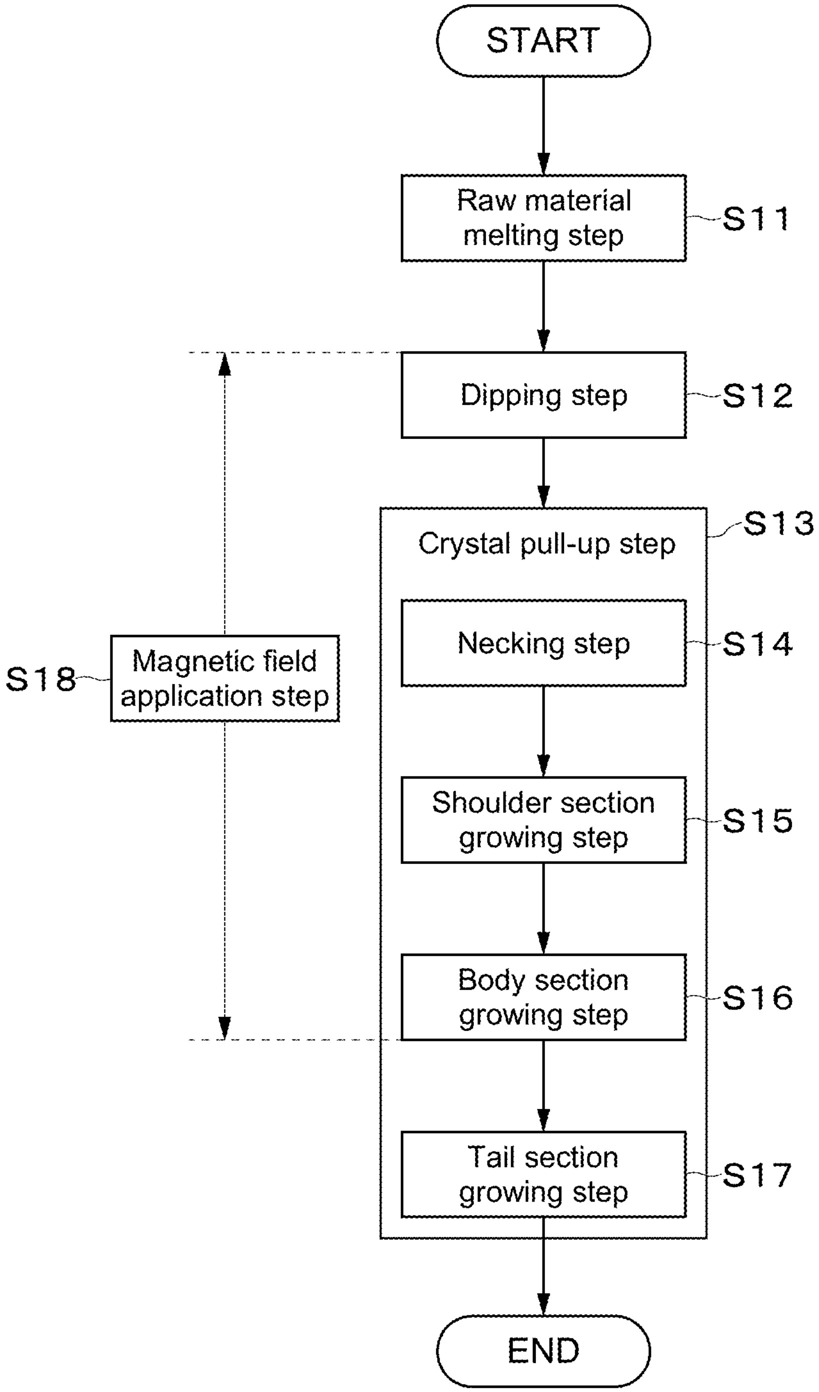
FIG. 2 is a flowchart illustrating a silicon single crystal manufacturing process according to an embodiment of the present invention.
Figure 3:
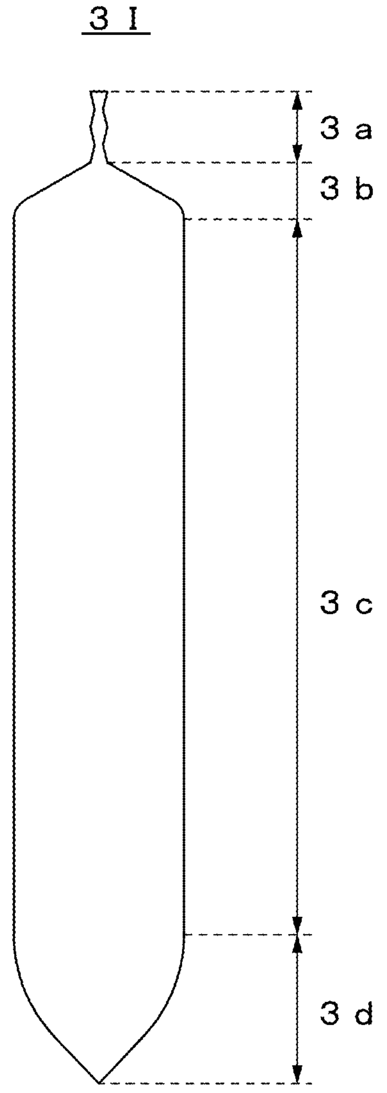
FIG. 3 is a substantially cross-sectional view illustrating the shape of a silicon single crystal ingot.

FIG. 2 is a flowchart illustrating a silicon single crystal manufacturing process according to an embodiment of the present invention. FIG. 3 is a substantially cross-sectional view illustrating the shape of a silicon single crystal ingot.

As illustrated in FIG. 2, the manufacturing process of the silicon single crystal according to the present embodiment has a raw material melting step S11 of heating a silicon raw material in the quartz crucible 11 with the heater 15 to melt it to generate the silicon melt 2, a dipping step S12 of lowering a seed crystal attached to the leading end portion of the pull-up wire 18 to dip it into the silicon melt 2, and a crystal pull-up step S13 of gradually pulling up the seed crystal while maintaining a contacting state with the silicon melt 2 to grow a single crystal.

The crystal pull-up step S13 has a necking step S14 of forming a neck section 3*a* whose crystal diameter is narrowed so as to avoid dislocation, a shoulder section growing step S15 of forming a shoulder section 3*b* whose crystal diameter is gradually increased, a body section growing step S16 of forming a body section 3*c* whose crystal diameter is kept at a prescribed value (e.g., 320 mm), and a tail section growing step S17 of forming a tail section 3*d* whose crystal diameter is gradually reduced. At the end of the tail section growing step S17, the silicon single crystal 3 is separated from the silicon melt 2. Through the above steps, a silicon single crystal ingot 31 having the neck section 3*a*, shoulder section 3*b*, body section 3*c*, and tail section 3*d* as illustrated in FIG. 3 is completed.

Concurrently with the crystal pull-up step S13, a magnetic field application step S18 is carried out. In the magnetic field application step S18, during a time from the start of the dipping step S12 until the end of the body section growing step S16, a lateral magnetic field (a horizontal magnetic field) is applied to the silicon melt 2 in the quartz crucible 11. This can suppress convection of the silicon melt 2 to thereby reduce the amount of oxygen to be dissolved from the quartz crucible 11 into the silicon melt 2. This further suppresses waving of the melt surface 2*s* to allow the crystal pull-up step to be performed stably.

In the crystal pull-up step S13, the height position of the melt surface 2*s* and the diameter of the silicon single crystal 3 are calculated from the photographed image taken by the camera 20. The height position of the melt surface 2*s* is calculated as the gap GA between the lower end of the heat shielding body 17 and the melt surface 2*s*. The crystal diameter and the gap are feedback-controlled according to a profile previously determined in accordance with the crystal growth stage. The camera 20 and image processor 21 constitute a melt surface measuring unit periodically measuring the height of the melt surface 2*s* of the silicon melt 2.

In the body section growing step S16, the gap is measured precisely with a very short sampling period, and the oxygen concentration in the silicon single crystal is estimated from a minute gap variation. Then, based on the estimation result of the oxygen concentration, crystal growth conditions are adjusted. Specifically, crystal growth conditions are adjusted so as to reduce the oxygen concentration when the estimation value of the oxygen concentration is larger than a target value and to increase the oxygen concentration when the estimation value of the oxygen concentration is smaller than a target value. The crystal growth conditions include at least one of crucible rotation speed, Ar gas flow rate, and in-furnace pressure.

The following describes in detail the estimation method of the oxygen concentration in the silicon single crystal.

Figure 4:
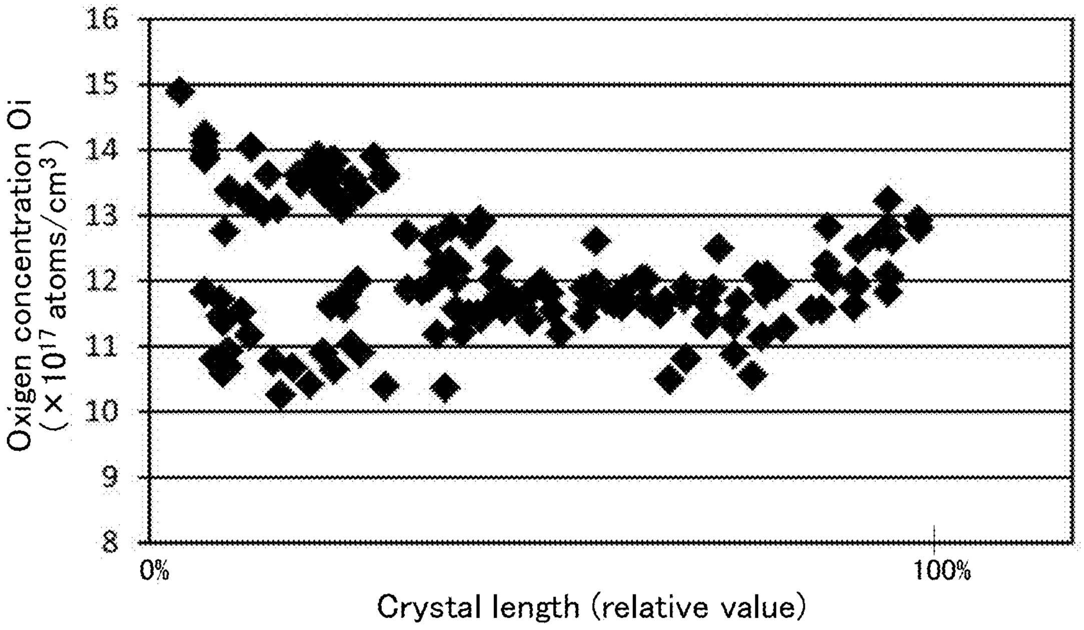
FIG. 4 is a graph illustrating distribution of the oxygen concentration in a plurality of silicon single crystals which have been grown with the same silicon single crystal manufacturing apparatus under the same conditions.

FIG. 4 is a graph illustrating distribution of the oxygen concentration in a plurality of silicon single crystals which have been grown with the same silicon single crystal manufacturing apparatus under the same conditions. The horizontal axis represents crystal length (relative value), and the vertical axis represents oxygen concentration ($\times 10^{17}$ atoms/cm$^3$). The crystal length (relative value) indicates a relative position in the growth direction of the silicon single crystal obtained when the start and end positions of the body section are set to 0% and 100%, respectively.

Figure 5A:
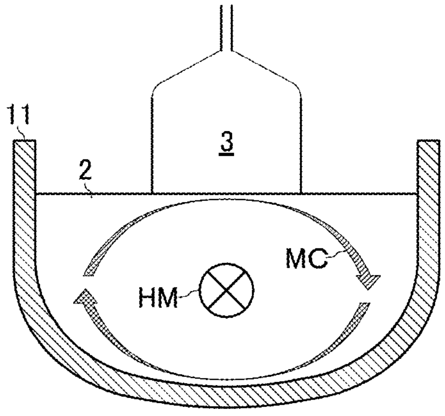
Figure 5B:
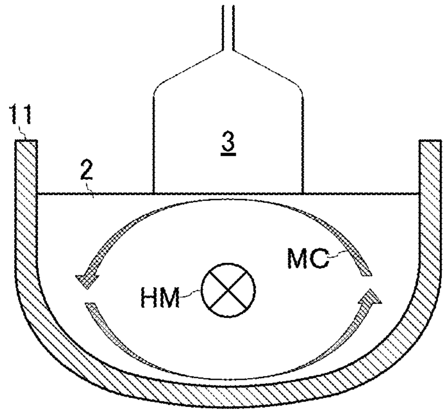

As illustrated in FIG. 4, the oxygen concentration distribution in the crystal growth direction of the silicon single crystal is divided into cases where the oxygen concentration is high and where it is low in the first half (in a range from the upper end (0%) of the body section to 40% thereof) of the body section growth state. Although a fundamental cause of such polarization of the oxygen concentration in the silicon single crystal 3 is not clear, it is considered that the polarization may be caused by melt convection MC in the quartz crucible 11. That is, it is estimated that the difference between the high oxygen concentration and the low oxygen concentration may occur depending on whether the melt convection MC in the quartz crucible 11 assumes a clockwise roll flow (see FIG. 5A) or a counterclockwise roll flow (see FIG. 5B) as viewed in the traveling direction of a horizontal magnetic field HZ, as illustrated in FIGS. 5A and 5B. A correlation between the roll flow direction (clockwise/counterclockwise) of the melt convection MC and the oxygen concentration (high/low) in the silicon single crystal 3 is not clear.

A major problem is that even though the silicon single crystal 3 is manufactured with the same silicon single crystal manufacturing apparatus 1 under the same growth conditions, the roll flow direction (clockwise/counterclockwise) of the melt convection MC is not uniquely determined to cause polarization of the oxygen concentration due to a difference in the convection mode. This fails to make the oxygen concentration in the silicon single crystal 3 to fall within a specified range over the entire length of the silicon single crystal 3, lowering the manufacturing yield of the silicon single crystal 3.

Figure 6:
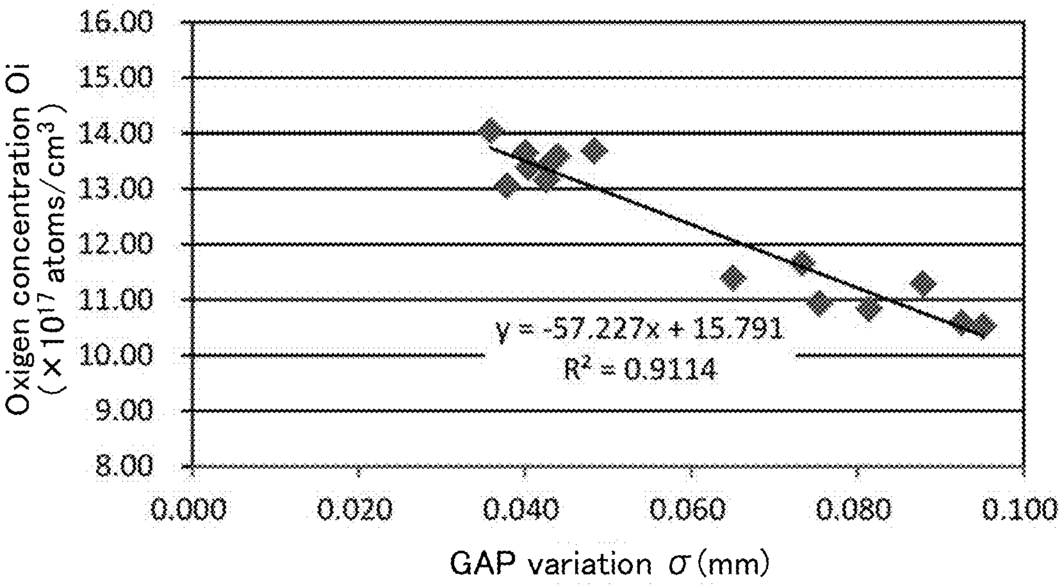
FIG. 6 is a graph illustrating the relation between the oxygen concentration in the silicon single crystal and the measurement value of a minute gap variation (GAP variation).

FIG. 6 is a graph illustrating the relation between the oxygen concentration in the silicon single crystal and the measurement value of a minute gap variation. The horizontal axis represents the minute gap variation (GAP variation), and the vertical axis represents the oxygen concentration in the silicon single crystal in an area where the oxygen concentration is polarized. In particular, the horizontal axis represents a standard deviation σ (mm) of the gap measurement value when the crystal length of the body section falls in the range of 0 mm to 100 mm, and the vertical axis represents an average value ($\times10^{17}$ atoms/$cm^3$) of the oxygen concentration when the crystal length of the body section falls in the range of 200 mm to 600 mm.

The graph of FIG. 6 reveals that the oxygen concentration in the silicon single crystal is polarized and that the minute gap variation σ becomes large with a low oxygen concentration and becomes small with a high oxygen concentration. That is, there is a strong correlation between the minute gap variation and the oxygen concentration in the silicon single crystal.

Figure 7A:
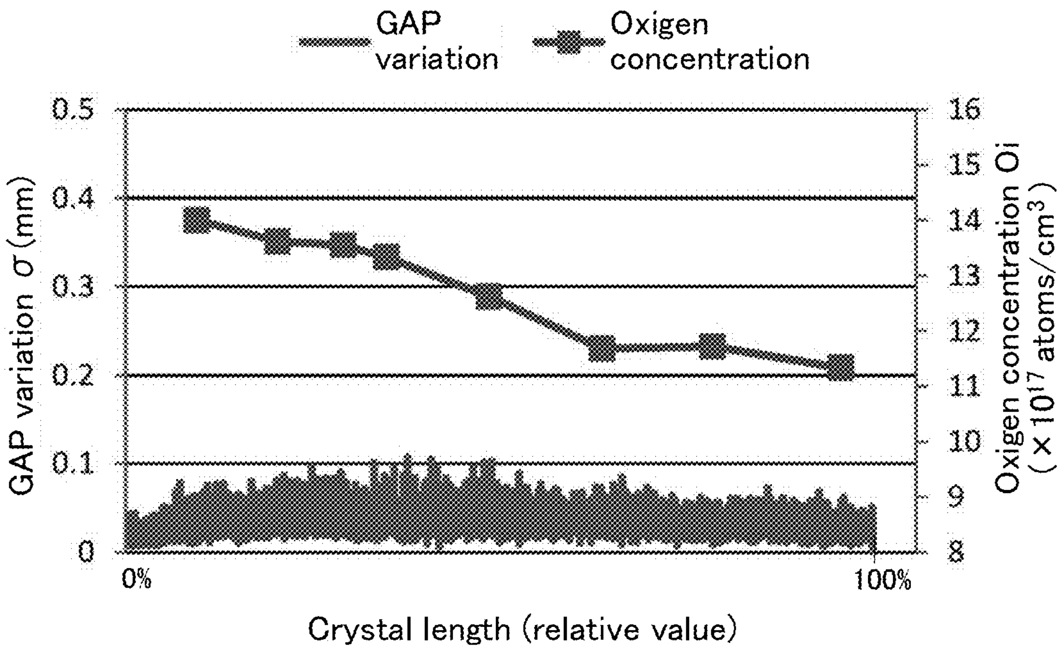
Figure 7B:
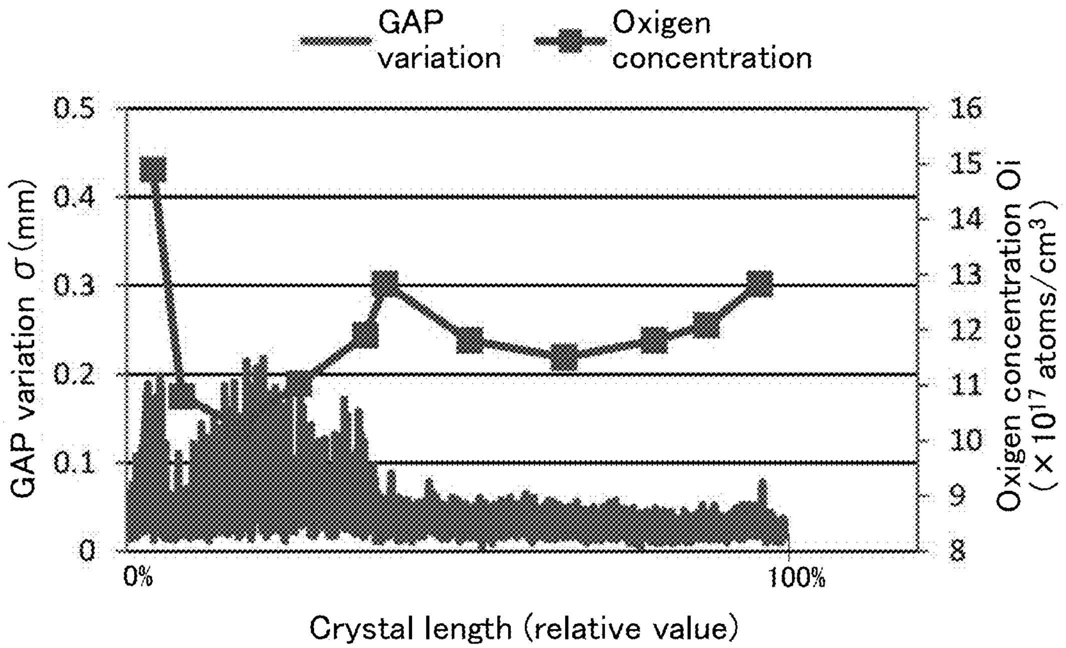

FIGS. 7A and 7B are graphs illustrating the relation between the minute gap variation and the oxygen concentration. The horizontal axis represents crystal length (relative value), the left vertical axis represents the gap variation a (mm), and the right vertical axis represents oxygen concentration (atoms/$cm^3$). Further, FIG. 7A illustrates a case where the oxygen concentration in the silicon single crystal becomes high, and FIG. 7B illustrates a case where the oxygen concentration in the silicon single crystal becomes low.

As illustrated in FIG. 7A, when the gap variation is small, the oxygen concentration tends to become high in the range where the crystal length of the body section is 60% or less. On the other hand, the gap variation is small and stable.

As illustrated in FIG. 7B, when the gap variation is large, the oxygen concentration tends to become low in the range where the crystal length of the body section is 40% or less. On the other hand, the gap variation σ becomes large in the range where the crystal length of the body section is 40% or less.

As described above, there is a certain correlation between the gap variation and the oxygen concentration. Thus, in the present embodiment, the gap variation is measured during the body section growth, the polarization direction of the oxygen concentration in the silicon single crystal is estimated based on the measured gap variation, and crystal growth conditions are adjusted based on the estimation result, so as to suppress the polarization of oxygen concentration and to stabilize crystal quality.

A large gap variation does not always occur when the oxygen concentration in the silicon single crystal is low but can occur when the oxygen concentration in the silicon single crystal is high, and the relation between the behavior of the gap variation and polarization of the oxygen concentration differs for each silicon single crystal manufacturing apparatus. Further, the polarization of oxygen concentration does not always occur immediately after the start of the body section growth but can occur after the growth of the body section has proceeded to some degree, and the timing at which the polarization of oxygen concentration occurs also differs for each silicon single crystal manufacturing apparatus. Therefore, the relation between the behavior of the gap variation and the direction (whether the oxygen concentration becomes high or low with a large gap variation) of the polarization of oxygen concentration and a sampling period (oxygen concentration estimation period) of a gap measurement value for oxygen concentration estimation need to be set for each silicon single crystal manufacturing apparatus based on previous result data on a plurality of pulled-up silicon single crystals.

Figure 8:
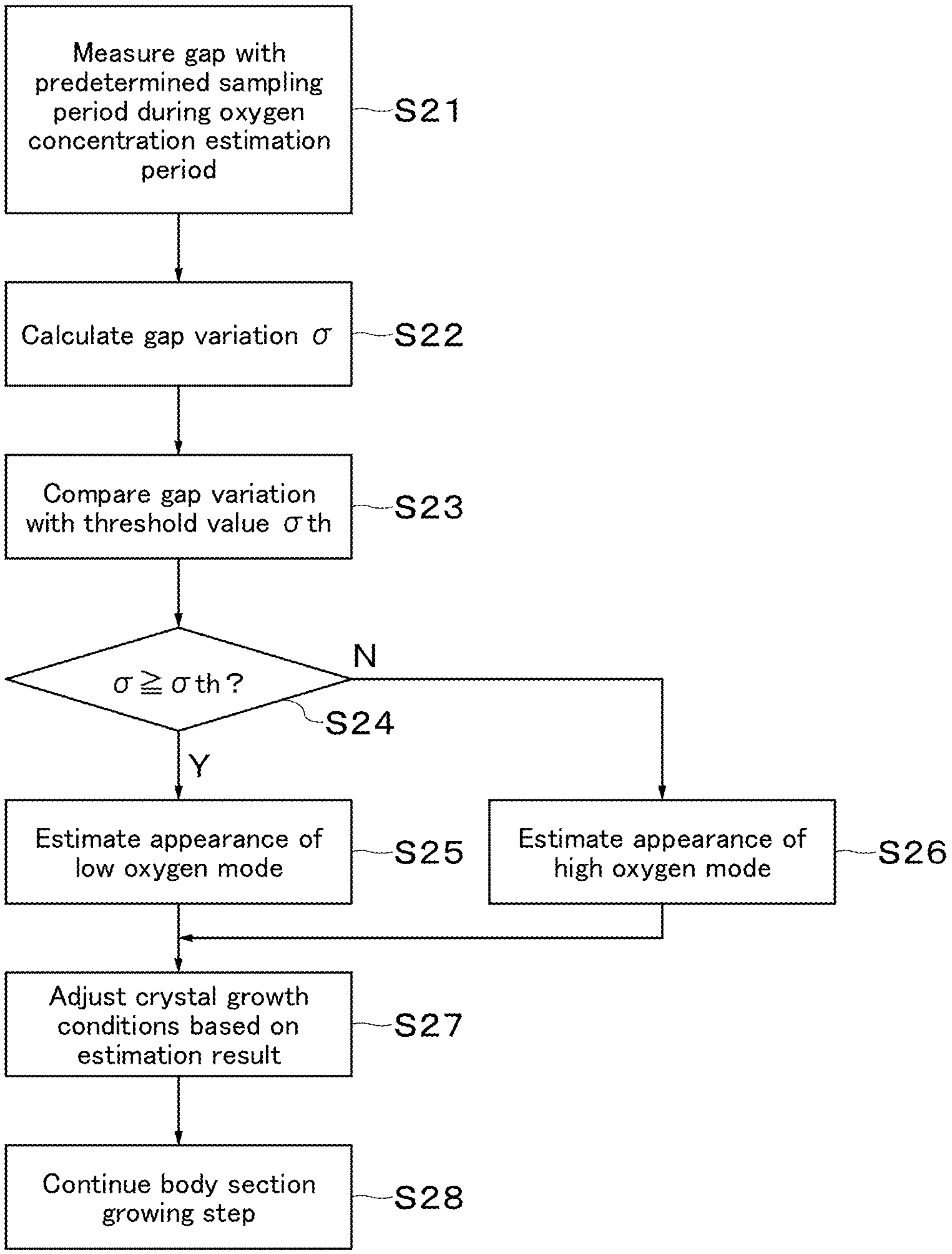
FIG. 8 is a flowchart explaining a method of estimating the oxygen concentration in the silicon single crystal.

FIG. 8 is a flowchart explaining a method of estimating the oxygen concentration in the silicon single crystal.

As illustrated in FIG. 8, in the estimation of the oxygen concentration, a gap which is the height of the melt surface with reference to the heat shielding body is measured with a predetermined sampling period during a previously set oxygen concentration estimation period (step S21).

The oxygen concentration estimation period is a sampling period of a gap measurement value for oxygen concentration estimation set during the body section growing step and is determined from previous results on the crystal pulling-up. For example, in one silicon single crystal manufacturing apparatus in which there is a tendency that the oxygen concentration is polarized immediately after the start of the body section growth, a growing period of the body section ranging from 0 mm to 100 mm in crystal length is set as the sampling period. On the other hand, in another silicon single crystal manufacturing apparatus in which there is a tendency that the oxygen concentration is polarized after the growth of the body section has proceeded to some degree, a growing period of the body section ranging from 300 mm to 400 mm in crystal length is set as the sampling period.

The sampling period of the gap measurement value is set to a very short period of 50 seconds or less and is preferably seconds or less. Although it is generally necessary to measure the gap also in liquid surface position control that lifts the crucible in accordance with the lowering of the melt surface due to the consumption of the silicon melt to maintain the liquid surface position constant, the sampling period need not be set to such a short period but is one minute to several minutes at the shortest. However, when the gap measurement value is used for oxygen concentration estimation, the sampling period of the gap measurement value needs to be very short, whereby a local minute variation in the height of melt surface associated with a change in melt convection can be grasped accurately.

The resolution of the gap measurement value is 1 mm or less and is preferably 0.1 mm or less. By thus setting the resolution of the gap measurement value to 1 mm or less, it is possible to accurately grasp a local minute variation in the height of melt surface associated with a change in melt convection.

Then, a standard deviation σ which is an index indicating the magnitude of the gap variation measured during the oxygen concentration estimation period (sampling period) is calculated (step S22). The gap variation need not necessarily be calculated in standard deviation but may be calculated as deviation between an instantaneous value and a moving average value. In this case, the number of steps of the moving average is preferably 10 or more.

Then, the calculated gap variation σ is compared with a threshold value σth (step S23). When the gap variation σ is equal to or more than the threshold value σth ($\sigma \geq \sigma th$), it is estimated that the oxygen concentration becomes relatively low (step S24Y and step S25). On the other hand, when the gap variation σ is less than the threshold value σth ($\sigma < \sigma th$), it is estimated that the oxygen concentration becomes relatively high (step S24N and step S26).

As described above, the relation between the behavior of the gap variation and the polarization direction of the oxygen concentration differs for each silicon single crystal manufacturing apparatus 1. For example, there may be a case where when the gap variation σ is equal to or more than the threshold value σth, the oxygen concentration becomes relatively low in one apparatus while it becomes relatively high in another apparatus. In an identical silicon single crystal manufacturing apparatus, the tendency in which the oxygen concentration becomes relatively high or low is almost unvaried. Thus, it is necessary to previously identify the correlation between the gap variation and the polarization direction of the oxygen concentration for each silicon single crystal manufacturing apparatus and then to estimate the polarization direction of the oxygen concentration based on the identified correlation.

Then, crystal growth conditions are adjusted based on the estimation result of the oxygen concentration (step S27). The crystal growth conditions can include quartz crucible rotation speed, flow rate of inert gas to be supplied into the chamber 10 (crystal pull-up furnace), pressure inside the chamber 10, and the like. For example, an increase in the rotation speed of the quartz crucible can increase the oxygen concentration and, conversely, a reduction in the rotation speed can reduce the oxygen concentration.

As described above, the silicon single crystal manufacturing method according to the present embodiment measures the gap with a predetermined sampling period at the start of the body section growth and estimates the polarization direction of the oxygen concentration in the silicon single crystal from the magnitude of the gap variation. Then, the crystal growth conditions are controlled based on the obtained estimation result, whereby it is possible to reduce a variation in the oxygen concentration in the crystal growth direction of the silicon single crystal.

While the preferred embodiment of the present invention has been described, the present invention is not limited to the above embodiment, and various modifications may be made within the scope of the present invention, and all such modifications are included in the present invention.

For example, in the above embodiment, the gap between the heat shielding body and the melt surface is measured with the camera, and oxygen concentration in the silicon single crystal is estimated from the behavior of the gap variation; however, the present invention is not limited to such a method but may use various methods that can measure a minute height variation at a local area of the melt surface by monitoring the melt surface and, in this case, the oxygen concentration can be estimated from the height variation at a local area of the melt surface.

EXAMPLES

Example 1

Pull-up of a silicon single crystal having a diameter of about 310 mm was performed according to the HMCZ method. In the crystal pull-up process, the body section of the silicon single crystal ranging from the start position thereof to 100 mm in the crystal longitudinal direction was set as an oxygen mode evaluation area for evaluation of the polarization direction of the oxygen concentration in the silicon single crystal, the gap variation in the oxygen mode evaluation area was monitored, and the standard deviation σ which is an index of the gap variation was calculated. For calculation of the standard deviation σ of the gap variation, values of a local gap measured at a part of the lower end of the heat shielding body were used, although the gap between the heat shielding body and the melt surface can be measured over the entire periphery of the heat shielding body lower end.

The threshold value σth of the gap variation was set to 0.15, and it was estimated from previous result data (POR) on silicon single crystal pull-up that high oxygen mode appeared when the gap variation was smaller than the threshold value (σ<0.15) and low oxygen mode appeared when the gap variation was equal to or larger than the threshold value (σ≥0.15). Then, crystal growth conditions (Ar flow rate and in-furnace pressure) were adjusted such that the oxygen concentration becomes a target value ($12\times10^{17}$ atoms/cm$^3$) in the both modes.

Since which one of the high and low oxygen modes appears is not known, oxygen concentration adjustment parameters (Ar flow rate and in-furnace pressure) were set assuming that the high oxygen mode would appear. At the time point when a crystal length L of the body section became 100 mm, the standard deviation σ was less than 0.15 (σ<0.15), so that it was determined that "high oxygen mode" appeared. Thus, the body section growing process was continued with the set oxygen concentration adjustment parameters (Ar flow rate and in-furnace pressure) maintained as they are from the start of crystal growth.

The distribution of the oxygen concentration in the crystal growth direction of a silicon single crystal ingot according to example 1 thus obtained was evaluated. The result is illustrated in FIG. 9.

Figure 9:
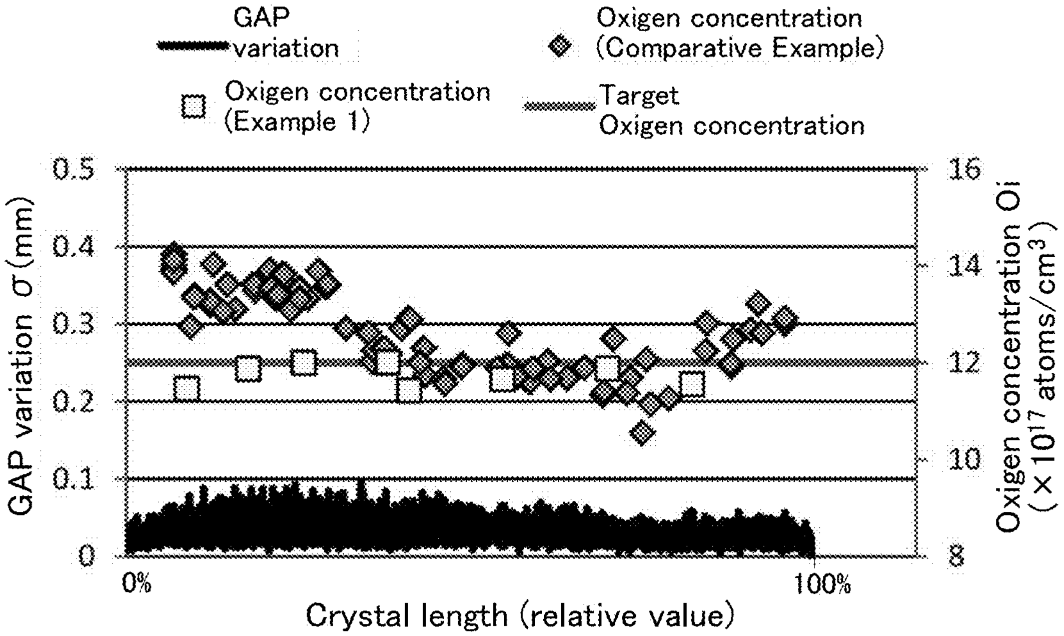
FIG. 9 is a graph illustrating the oxygen concentration distribution in the silicon single crystal according to example 1 together with the gap variation.

FIG. 9 is a graph illustrating the oxygen concentration distribution in the silicon single crystal according to example 1 together with the gap variation. The horizontal axis represents crystal length (relative value), the left vertical axis represents the gap variation σ (mm), and the right vertical axis represents oxygen concentration (atoms/cm$^3$). In FIG. 9, eight square plots represent the oxygen concentration distribution of the silicon single crystal according to example 1 for which the crystal growth conditions are adjusted based on the estimation result of the oxygen mode. On the other hand, a large number of rhombic plots represent the oxygen concentration distribution (polarization distribution) of the silicon single crystal according to a comparative (conventional) example for which estimation of the oxygen concentration and adjustment of the crystal growth conditions are not performed. Further, the very steep line graph below the square and rhombic plots represents a change in the gap variation measured during the growth of the silicon single crystal according to example 1.

As is clear from FIG. 9, the oxygen concentration distribution of the silicon single crystal according to example 1 was closer to a target value ($12\times10^{17}$ atoms/cm$^3$) than that of the silicon single crystal according to comparative example.

Example 2

Pull-up of a silicon single crystal mm was performed using the same crystal pull-up apparatus and the same crystal pull-up conditions as in example 1. Since which one of the high and low oxygen modes appears is not known, oxygen concentration adjustment parameters (Ar flow rate and in-furnace pressure) were set assuming that the high oxygen mode appeared. At the time point when the crystal length L of the body section became 100 mm, the standard deviation σ was equal to or larger than 0.15 (σ≥0.15), so that it was determined that "low oxygen mode" would appear. Thus, the body section growing process was continued with the oxygen concentration adjustment parameters (Ar flow rate and in-furnace pressure) changed to adjustment parameters for the low oxygen mode.

Figure 10:
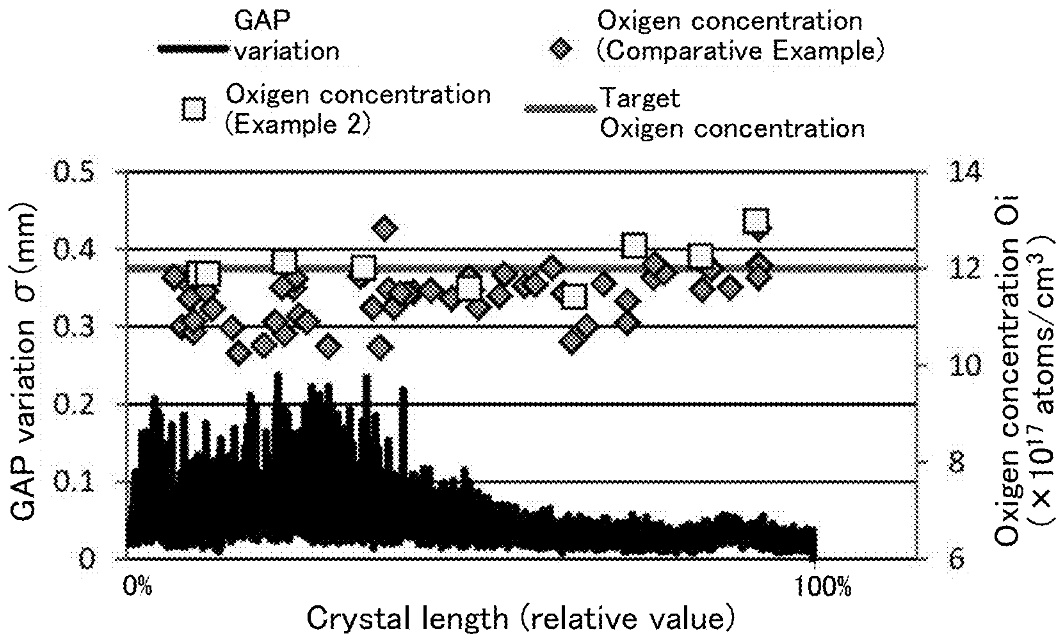
FIG. 10 is a graph illustrating the oxygen concentration distribution in the silicon single crystal according to example 2 together with the gap variation.

FIG. 10 is a graph illustrating the oxygen concentration distribution in the silicon single crystal according to example 2 together with the gap variation. The horizontal axis represents crystal length (relative value), the left vertical axis represents the gap variation σ (mm), and the right vertical axis represents oxygen concentration (atoms/cm$^3$). In FIG. 10, nine square plots represent the oxygen concentration distribution of the silicon single crystal according to example 2 for which the crystal growth conditions are adjusted based on the estimation result of the oxygen mode. On the other hand, a large number of rhombic plots represent the oxygen concentration distribution (polarization distribution) of the silicon single crystal according to a comparative (conventional) example for which estimation of the oxygen concentration and adjustment of the crystal growth conditions are not performed. Further, the very steep line graph below the square and rhombic plots represents a change in the gap variation measured during the growth of the silicon single crystal according to example 2.

As is clear from FIG. 10, the oxygen concentration distribution of the silicon single crystal according to example 2 was closer to a target value ($12\times10^{17}$ atoms/cm$^3$) than the silicon single crystal according to comparative example.

As described above, when high and low of the oxygen concentration was previously estimated from the behavior of the gap variation measured within the range from the start position of the body section to 100 mm in crystal length so as to adjust the crystal growth conditions, the oxygen concentration in the silicon single crystal was successfully brought close to a target value. By thus monitoring the gap variation and estimating the future behavior of the oxygen concentration, it is possible to accurately control the oxygen concentration in the silicon single crystal.

DESCRIPTION OF REFERENCE NUMERALS

1 Silicon single crystal manufacturing apparatus
2 Silicon melt
2*s* Melt surface
3 Silicon single crystal
31 Silicon single crystal ingot
3*a* Neck section
3*b* Shoulder section
3*c* Body section
3*d* Tail section
10 Chamber
10*a* Main chamber
10*b* Pull chamber
10*c* Gas inlet
10*d* Gas outlet
10*e* Observation window
11 Quartz crucible
12 Graphite crucible
13 Rotary shaft
14 Shaft drive mechanism
15 Heater
16 Heat insulating material
17 Heat shielding body
17*a* Opening of heat shielding body
18 Wire
19 Wire winding mechanism
20 Camera
21 Image processor
22 Controller
30 Magnetic field generator
31A, 31B Electromagnetic coils
GA Gap
HZ Horizontal magnetic field
MC Melt convection

The invention claimed is:

1. A method of estimating an oxygen concentration in a silicon single crystal being formed in a crystal pull-up furnace, comprising:

measuring a height position of a melt surface of a silicon melt in a quartz crucible when pulling up the silicon single crystal while applying a lateral magnetic field to the silicon melt; and estimating whether the oxygen concentration in the silicon single crystal will be at a target oxygen concentration value, or diverged from the target oxygen concentration value based on a minute variation in the height position of the melt surface, wherein the height position of the melt surface is periodically measured with a sampling period of 50 seconds or less; and when the oxygen concentration in the silicon single crystal is determined to be diverged from the target oxygen concentration value, adjusting at least one of a rotation speed of the quartz crucible, a flow rate of inert gas supplied into the crystal pull-up furnace, and a pressure inside the crystal pull-up furnace such that the estimated oxygen concentration in the silicon single crystal becomes closer to the target oxygen concentration value.

2. The method of estimating the oxygen concentration in the silicon single crystal according to claim 1, wherein a resolution of a measurement value of the height position of the melt surface is 0.1 mm or less.

3. The method of estimating the oxygen concentration in the silicon single crystal according to according to claim 1, further comprising:

forming a correlation between the minute variation in the height position of the melt surface and a change in the oxygen concentration from previously collected result data on silicon single crystal pull-up, and estimating whether the oxygen concentration in the silicon single crystal will be at the target oxygen concentration value or diverged from the target oxygen concentration value based on the correlation.

4. The method of estimating the oxygen concentration in the silicon single crystal according to according to claim 1, wherein a crystal part where a divergence of oxygen concentration in the silicon single crystal from the target oxygen concentration value is identified from previous result data on silicon single crystal pull-up, and a period in which the identified crystal part is grown is set as an oxygen concentration estimation period for measuring the height position of the melt surface.

5. The method of estimating the oxygen concentration in the silicon single crystal according to claim 4, wherein the oxygen concentration estimation period is a period during which the silicon single crystal grows by 100 mm.

6. The method of estimating the oxygen concentration in the silicon single crystal according to claim 1, wherein the oxygen concentration in the silicon single crystal is estimated from the minute variation in the height position of the melt surface measured within a certain range ranging downward from an upper end of a body section of the silicon single crystal.

7. The method of estimating the oxygen concentration in the silicon single crystal according to claim 1, wherein the minute variation in the height position of the melt surface is grasped by measuring the height position of the melt surface with reference to a lower end of a heat shielding body disposed above the silicon melt.

* * * * *